US 7,246,586 B2

(12) United States Patent
Hosenfeldt et al.

(10) Patent No.: US 7,246,586 B2
(45) Date of Patent: Jul. 24, 2007

(54) WEAR-RESISTANT COATING AND PROCESS FOR PRODUCING IT

(75) Inventors: Tim Matthias Hosenfeldt, Ebern (DE); Karl-Ludwig Grell, Aurachtal (DE)

(73) Assignee: INA - Schaeffler KG, Herzogenaurach (DE)

( * ) Notice: Subject to any disclaimer, the term of this patent is extended or adjusted under 35 U.S.C. 154(b) by 52 days.

(21) Appl. No.: 11/221,561

(22) Filed: Sep. 7, 2005

(65) Prior Publication Data

US 2006/0049035 A1   Mar. 9, 2006

(30) Foreign Application Priority Data

Sep. 9, 2004   (DE) ..................... 10 2004 043 550

(51) Int. Cl.
*F01L 1/14* (2006.01)
(52) U.S. Cl. ............................... 123/90.51; 123/90.19; 123/90.44; 123/90.48; 428/908.8; 29/888.03; 29/888.43; 427/249.18; 204/192.15
(58) Field of Classification Search ............. 123/90.51
See application file for complete search history.

(56) References Cited

U.S. PATENT DOCUMENTS 5,160,537 A * 11/1992 Terrat et al. ................ 106/36
5,237,967 A * 8/1993 Willermet et al. ....... 123/90.51
6,045,200 A    4/2000 Anderton et al.
6,367,439 B1 * 4/2002 Nishioka et al. ......... 123/90.51
6,399,219 B1 * 6/2002 Welty et al. ................ 428/626
6,631,907 B1 * 10/2003 Onoda et al. ............... 277/443
6,935,618 B2 * 8/2005 Welty et al. ................ 251/368
7,097,922 B2 * 8/2006 Shen et al. ................. 428/701

FOREIGN PATENT DOCUMENTS

| DE | 35 03 105 | 7/1985 |
|---|---|---|
| DE | 41 04 198 | 8/1992 |
| EP | 0 702 097 | 3/1996 |
| EP | 0 739 697 | 10/1996 |
| GB | 23 03 640 | 1/1993 |
| GB | 22 57 771 | 2/1997 |
| JP | 20-00 80 991 | 3/2000 |
| WO | 2004/022273 | 4/2004 |

* cited by examiner

*Primary Examiner*—Thomas Denion
*Assistant Examiner*—Kyle M. Riddle
(74) *Attorney, Agent, or Firm*—Lucas & Mercanti, LLP

(57) ABSTRACT

The present invention relates to a process for producing a wear-resistant coating and to a wear-resistant coating on predetermined surfaces of machine or engine parts, in particular for internal combustion engines, which are exposed to frictional wear, comprising at least one nanocrystalline functional layer (4) made up of at least two $CrN_x$ phases for reducing friction and increasing the wear resistance of the predetermined surface (2) of the machine or engine part (1).

26 Claims, 2 Drawing Sheets

WEAR-RESISTANT COATING AND PROCESS FOR PRODUCING IT

The present invention relates to a wear-resistant coating on predetermined surfaces of machine or engine parts which are exposed to frictional wear, and to a process for producing a wear-resistant coating of this type, in particular for machine or engine parts used in internal combustion engines.

Although it can be applied to any desired machine or engine parts, the present invention and the object on which it is based are explained in more detail on the basis of parts of internal combustion engines, in particular on the basis of valve gear components, such as for example bucket tappets.

There are known bucket tappet devices which are installed, for example, in motor vehicle engines with reciprocating pistons which have air inlet and air outlet valves which open and close in phase with the rotation of the crankshaft or synchronously therewith. A valve drive mechanism is used to transmit the movement of the cam arranged on the camshaft to the valves when the camshaft rotates together with the crankshaft of the engine. In the process, the cam of the camshaft comes into frictional contact with a running surface of the associated bucket tappet.

In general, modern valve gear components, such as for example bucket and pump tappets of this type, are subject to increasing demands with regard to wear resistance and preservation of resources. The reasons for the need for an increased wear resistance lie in the increasingly high loads and stresses in the tribological system comprising control cam and tappet. The reasons for this lie in new designs of engine, such as for example petrol and diesel direct injection systems, with ever greater injection pressures, an increasing proportion of abrasive particles in the lubricant, the absence of oil supply to the friction partners, which leads to an increased proportion of mixed friction, and the increasing use of tribologically unfavourable steel cams in order to reduce costs and mass. The reduction of the friction losses in the valve gear, with resulting fuel saving combined, at the same time, with an increase in the service life of the valve gear as a whole, represents an important contribution to the preservation of resources. To effectively reduce the friction losses, it is necessary to lower the frictional torque over a wide engine speed range.

It is known for bucket tappets of this type to be designed as light metal tappets for the valve control of an internal combustion engine, comprising a tappet base body and a steel plate with a hardened surface inserted at the contact surface for the control cams of the valve control.

However, one drawback of this approach is the fact that bucket tappets of this type, in operation, are exposed to relatively major temperature fluctuations from −30° C. during a cold start up to approx. 130° C. when an internal combustion engine is operating. In this context, the possibly differing thermal expansion of the materials used constitutes a problem. Although the steel plate inserted as a wear-resistant inlay into a light metal tappet has good wear properties, it tends to become detached in the event of a corresponding thermal load. Consequently, the ability to withstand thermal loads is limited. A further drawback in use is that installation space is lost in the form of a relatively wide edge as a functional surface or cam contact surface which comes into contact with the control cam of a valve control.

According to one prior art approach, it is also known to provide running surfaces of the machine or engine parts exposed to frictional wear with wear-resistant layers which, depending on the particular application, preferably consist of metals applied by electroplating or of metals and/or metal alloys applied in a thermal spraying process, if appropriate with hard material additions.

However, one drawback which has been found for this approach is that metal layers applied by thermal spraying have a relatively low strength, and it is therefore known, in order to improve the strength, to remelt the metal layers after they have been applied, for example by plasma jets, laser beams, electron beams or by an arc, in such a manner that the sprayed materials are mixed in molten form with the base material which is simultaneously melted in the surface region, so as to form an alloy. However, the remelting alloying operation produces inhomogeneous zones of different compositions in which both the base material and the layer material may dominate. If the proportion of base material is too high, the wear to the layer is too high, and if the proportion of base material is too low, with various layer combinations there is a risk of the formation of macro-cracks, which means that such layers cannot be used. In such a case, frictional loads may cause undesirable adhesive wear to the layers.

Furthermore, the Applicant is aware of the approach of nitrocarburizing and/or carbonitriding the running surface of the bucket tappet by means of a thermochemical process. However, this approach has proven to have the drawback that the coefficient of friction achieved is unsatisfactory and the wear resistance is too low.

Furthermore, the Applicant is aware that the running surface of the tappet can be coated with a manganese phosphate layer or a sliding coating. In this case too, the coefficient of friction and wear resistances achieved are not satisfactory. Moreover, materials of this type represent unnecessary environmental pollution. The same applies to electroplating layers, which can likewise be applied to the running surfaces.

Furthermore, the prior art has disclosed as coating materials hard metals and high-speed steels (ASP 23), but in addition to an unsatisfactory coefficient of friction and an unsatisfactory wear resistance, these materials also have a disadvantageously high mass. Furthermore, their production is associated only with a high manufacturing outlay.

The Applicant is additionally aware of hard layers, such as for example TiN, CrN, (Ti, Al)N, produced for example by means of a PVD or (PA)CVD process. However, the fact that these layers lead to high wear to the opposing body if they are not remachined proves to be a drawback of this approach. In the case of remachining, undefined surface states result on account of the reactive surfaces.

U.S. Pat. No. 5,237,967 has disclosed carbon-based PVD and (PA)CVD layers containing 20 to 60 atom % of hydrogen in the covering layer, known as metal-containing hydrocarbon layers (Me-C:H) and amorphous hydrocarbon layers (a-C:H). However, the wear resistance and chemical stability of these layers are too low. Furthermore, their coefficient of liquid friction is too high, since they do not ensure reduction of friction in the oil-lubricated state.

As has already been explained above, a reduction in friction in the valve gear is a necessary contribution to fuel saving and preservation of resources. This objective can be achieved by reducing the solid-state and mixed friction range and therefore increasing the liquid friction range with complete material separation. This is achieved by using the lowest possible total roughness $R_{Tot}$ of the tribological system comprising bucket tappet and camshaft. The total roughness $R_{Tot}$ results from the following equation:

$$R_{Tot} = ((R_{bucket\ tappet})^2 + (R_{camshaft})^2)^{0.5},$$

where $R_{bucket\ tappet}$ denotes the surface roughness of the bucket tappet and $R_{camshaft}$ denotes the surface roughness of the camshaft.

To maintain the required low roughness of the bucket tappet throughout its entire service life, it is necessary for the surface to be configured in such a way that it has a high wear resistance, a low tendency to adhere to the opposing body and low reactivity with respect to its surroundings. Furthermore, the surface should preferably not contain any abrasive particles, such as droplets.

The bucket tappets made from iron-carbon alloys, even in the heat-treated, for example carbonitrided, nitrocarburized or nitrided state, do not achieve the required wear resistances and tribological favourable surface states. If, for example, nitride layers are subsequently mechanically treated, in particular by (precision) grinding, lapping, polishing, blasting, etc., it is not only the surface structure but also the chemical composition and reactivity of the surface which change. These changes are on the one hand subject to considerable degrees of divergence, which means that it is impossible to achieve a constant quality. On the other hand, surfaces with a topographic affinity have unfavourable tribological properties and tend to adhere to the opposing body. Furthermore, grinding and polishing processes induce internal compressive stresses in the regions close to the surface, over and above the high internal compressive stresses which are already present in the layer of hard material.

In addition, the induced dislocations and the droplets which have been torn out lead to voids and microcracks, so that the long-term local strength of the layer on bucket tappets is reduced and the bonding strength is lowered to the extent that the layer may even flake off when it is remachined.

However, if, for example in the case of the layers deposited using an arc process, the layers are not subsequently polished, the hard droplets lead to abrasive wear to the opposing body or at least to uncontrolled polishing of the opposing body, resulting in unpredictable adverse consequences. Furthermore, during operation the droplets break out of the layer, which leads to damage to the layer and to free particles with an abrasive action.

Therefore, the present invention is based on the object of providing a coating and a process for producing such a coating which eliminate the abovementioned drawbacks and in particular reduce the moment of friction throughout the entire range of use as well increasing the service life of the coated machine or engine part and of the opposing body.

According to the invention, this object is achieved, in terms of the apparatus, by a wear-resistant coating having the features of Patent Claim 1 and, in terms of the process, by a process having the features of Patent Claim 17.

The idea on which the present invention is based consists in the wear-resistant coating comprising at least one nanocrystalline functional layer made up of at least two $CrN_x$ phases for reducing friction and increasing the wear resistance of the predetermined surface of the machine or engine part.

Therefore, the present invention has the advantage over the known prior art approaches that the coefficient of friction is considerably reduced and the service life of the coated machine or engine part and of the associated opposing body is increased. Furthermore, the coating can be implemented in such a manner that no droplets are formed and there is no increase in the surface roughness. Furthermore, considerably higher hardness values are achieved compared to heat-treated surfaces. As a result, a lower tendency to adhere to the opposing body and improved separation from the opposing body are ensured. The $CrN_x$ mixed phases of the coating allow an optimized chemical composition, an optimized microstructure and an optimized morphology to be achieved.

The subclaims give advantageous configurations and improvements of the wear-resistant coating given in Patent Claim 1 and of the method given in Patent Claim 17.

According to a preferred refinement, the at least one functional layer consists of a meta-stable mixed phase comprising predominantly $Cr_2N$ and $CrN$. The proportion of $Cr_2N$ in the meta-stable mixed phase is preferably at least 70%. The formation of a meta-stable mixed phase of this type between the $Cr_2N$ lattice and the $CrN$ lattice, which are in nanocrystalline form, produces favourable tribological and mechanical properties of the layer system. The functional layer is preferably optimized by a suitable mixed phase. It is advantageous for the at least one functional layer to have a grain size in the region of 10 nm. On account of the small grain size and the mixed phase comprising predominantly $Cr_2N$ and with smaller quantities of $CrN$ mean that the nanocrystalline layers have fewer defects and a significantly lower increase in roughness. The nanocrystalline structure also leads to a drop in the dislocation density, with the result that the risk of crack formation is reduced. Furthermore, the small grain boundaries serve as effective crack barriers, since on account of the grain sizes of approximately 10 nm, the maximum crack lengths are likewise only approximately 10 nm. Consequently, the stress intensity factor at the tip of the crack is so low when the grain boundary is reached that the grain boundary cannot be overcome, with the result that the crack cannot propagate.

According to another preferred exemplary embodiment, the at least one functional layer has hardness values of between 2500 HV and 3200 HV. Consequently, the wear resistance of the coated body is considerably increased compared to heat-treated surfaces, and the tendency to adhere to the opposing body is reduced and the separation from the opposing body is improved by a lubricating film. For certain applications, the hardness of the covering layer may be reduced to lower hardnessess down to 1600 HV, in order to be more gentle on the opposing body in frictional contact.

According to another preferred exemplary embodiment, the at least one functional layer has a roughness average $R_a$ of at most 0.04 µm. Such a low surface roughness, together with the topography with characteristic positive material fractions and shallow slope angles or hills obtained, leads to gentle smoothing of the opposing body and therefore to a decrease in the total roughness $R_{Tot}$ of the tribological system comprising, for example, bucket tappet and the opposing body. The low total roughness $R_{Tot}$ shifts the Stribeck curve to the left, resulting in a decrease in the friction states with solid-state contact and therefore the states which are critical to wear and the friction. The high wear resistance and the high hardness additionally lead to the smooth surface and layer thickness being maintained during operation subject to friction.

It is preferable for the at least one functional layer to comprise a plurality of nanocrystalline individual layers made up of at least two $CrN_x$ phases, in which case the individual layers can be applied with a graduated or constant layer composition.

According to a further preferred exemplary embodiment, at least one supporting layer and/or at least one bonding layer, which is formed, for example, by means of a PVD process as a metal-containing, for example, tungsten-comprising carbon layer, as a layer which includes carbides and/or nitrides of the transition metals, as a layer which is nitrocarburized, carbonitrided or case-hardened by means of a heat treatment, as a layer which is borided or nitrided by means of a thermochemical process and/or as a layer which includes chromium formed, for example, by means of an electroplating process, is provided between the predetermined surface of the machine or engine part and the tetrahedral amorphous carbon layer. It is preferable for the at least one supporting layer and/or bonding layer in each case to have a thickness of from 0.1 µm to 4.0 µm, in which case the thickness can in turn in each case be adapted to the appropriate requirements or to the customer's wishes.

By way of example, the predetermined surface of the machine or engine part consists of 16MnCr5, C45, 100Cr6, 31CrMoV9, 80Cr2 or the like.

Advantageous uses of the coatings according to the invention include an opposing running layer on an opposing running member, formed as a bucket tappet, a drag lever or a rocker lever, in internal combustion engines, the cam contact surface or the cam contact surface and/or the bucket skirt of the bucket tappet, predetermined surfaces of valve gear components, in particular of mechanical and hydraulic bucket tappets, of hydraulic supporting and insertion elements, of valve stems or valve stem supports, of rolling bearing components, of control pistons, of release bearings, of piston pins, of bearing bushes, of linear guides or the like. In this case, it is advantageously possible for only certain areas of the individual machine or engine parts or the entire surfaces of the machine or engine parts to be formed with a coating according the invention.

The predetermined surface of the machine or engine part preferably has a roughness average $R_a$ of at most 0.03 µm. This can be established, for example, by suitable machining of the base body before it is coated.

According to another preferred exemplary embodiment, the at least one nanocrystalline functional layer is deposited on the predetermined surface of the machine or engine part by means of a PVD process, preferably by means of a reactive PVD sputtering process. In this case, it is advantageously possible in addition for carbon to be subplanted into the at least one functional layer. The deposition of the at least one functional layer is advantageously carried out at a coating temperature which is lower than the tempering temperature of the machine or engine part.

According to a further preferred exemplary embodiment, the at least one deposited functional layer is not remachined. This makes it possible to maintain low surface roughnesses, with the result that the frictional moment is additionally reduced. Likewise, it is preferable for no subsequent heat treatment to be carried out on the machine or engine part, so that there are no changes to properties originally achieved in the deposited coating during any further processing operations.

The invention is explained in more detail below on the basis of exemplary embodiments and with reference to the appended figures of the drawing, in which.

In the figures, identical reference designations denote identical or functionally equivalent components unless stated otherwise.

Figure 1:
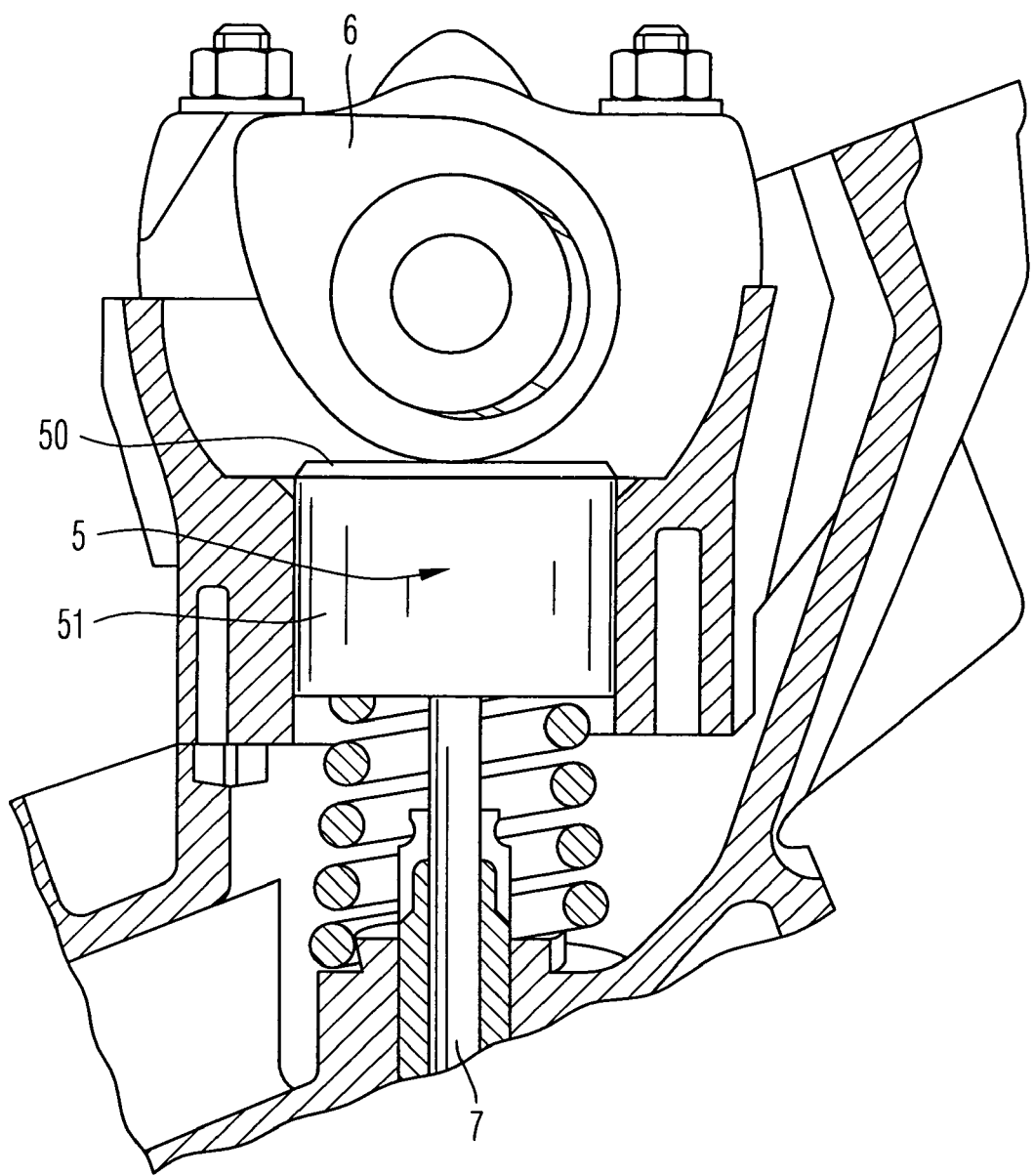
FIG. 1 shows a front view of a friction pairing, comprising bucket tappet and camshaft, for operation of a valve of an internal combustion engine.
Figure 2:
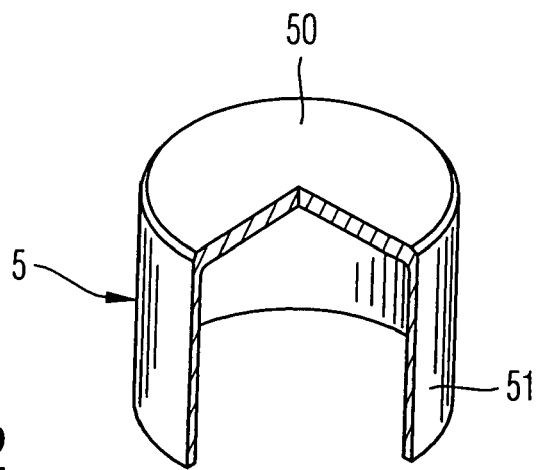
FIG. 2 shows a perspective view of the bucket tappet from FIG. 1.

FIG. 1 illustrates a friction pairing, comprising a bucket tappet 5 with a cam contact surface 50 and a bucket skirt 51, and a cam 6. The bucket tappet 5 is illustrated in more detail in a perspective view in FIG. 2. The bucket tappet 5, as a general representative of engine parts in internal combustion engines, is connected to the stem 7 of a valve, which opens or closes the valve through contact of the cam surface with the cam contact surface 50 of the bucket tappet 5.

In general, modern valve gear components, such as for example bucket and pump tappets, are subject to high demands with regard to the wear resistance and preservation of resources, in particular at the contact surface 50.

An exemplary embodiment of the present invention is explained in more detail below in conjunction with FIG. 4, which illustrates a diagrammatic cross-sectional view through a wear-resistant coating for a machine or engine part 1, for example for a bucket tappet 5, in accordance with a preferred exemplary embodiment of the present invention.

To reduce the coefficient of friction and to increase the wear resistance in the region of the cam contact surface 50 or if necessary in the region of the cam contact surface 50 and of the bucket skirt 51, the bucket tappet 5 is coated with a wear-resistant coating according to the invention. In the case of high levels of deformation to the bucket skirt 51 of the bucket tappet 50 in the region of the open side, it is optionally also possible for the bucket skirt 51 to be partially coated, for the cam contact 50 alone to be coated or for the friction-resistant coating to be at least partially removed at a later stage in the region of the bucket skirt 51 of the bucket tappet 5.

In the present case, it is initially assumed that the cam contact surface 50 of the bucket tappet 5 is regarded as the predetermined surface 2 of the engine part. It will be clear to a person skilled in the art that any desired predetermined surfaces of any desired machine or engine parts can be coated with the coating according to the invention.

The predetermined surface 2, i.e. in the present case the cam contact surface 50 of the bucket tappet 5, is preferably case-hardened or carbonitrided and tempered before being coated.

The base body, in the present case the cam contact surface 50 of the bucket tappet 5, which advantageously consists of an inexpensive steel material, such as for example 16MnCr5, C45, 100Cr6, 31CrMoV9, 80Cr2 or the like, according to the present exemplary embodiment is then coated with a supporting layer 3 and/or a bonding layer 3. The supporting layer 3 or the bonding layer 3 may, for example, in each case consist of a metal-containing carbon, for example of a compound of tungsten and carbon, or alternatively of other metallic materials, e.g. Cr, Ti, as well as borides, carbides and nitrides of the transition metals. The supporting layer 3 and/or the bonding layer 3 can, for example, be formed by heat treatment, for example case hardening, carbonitriding, nitrocarburizing, by a thermochemical process, for example nitriding, boriding, by an electroplating process, for example by applying a chromium-containing layer, or by means of a PVD process, for example by applying Me-C, carbides and nitrides of the transition metals. In the case of a PVD process, such as for example the sputtering or ARC technique, if appropriate metals are vaporized and applied as a layer to the substrate with the addition of reactive gases (e.g. nitrogen). Chromium is vaporized as the solid starting material and is deposited as a partially crystalline layer on the predetermined surface 2 of the bucket tappet 5 by being enriched with nitrogen atoms through the introduction of a high level of energy.

It should be mentioned at this point that only one supporting layer 3 or one bonding layer 3, a plurality of supporting layers 3 or a plurality of bonding layers 3 or a combination of these two layers may be formed on the base body or the predetermined surface 2 of the bucket tappet 5. If it is desirable to improve the bonding of the wear-resistant coating, which is yet to be formed, or a supporting layer to the base body, a layer as bonding layer 3 with a thickness of, for example, 0.1 μm to 2.0 μm is formed on the base body. However, if the layer is to serve as a supporting layer, i.e. as a mechanical support between the base body and the wear-resistant coating which is yet to be formed, thicknesses of, for example, 2.0 μm to 4.0 μm are advantageous. The supporting layer is intended to increase the fatigue strength, i.e. to prevent plastic deformation, the formation of cracks, the propagation of cracks and fractures in the layer system. Fatigue phenomena of this nature may occur through loading of the cam and the material stresses induced as a result in the bucket tappet 5, with the assistance of different hardnesses, moduli of elasticity, deformability of the individual layers or the base body and the wear-resistant coating. In this case, it is preferably for the layer 3 to be formed as a supporting layer 3, either on its own or in combination with a suitable bonding layer.

Figure 4:
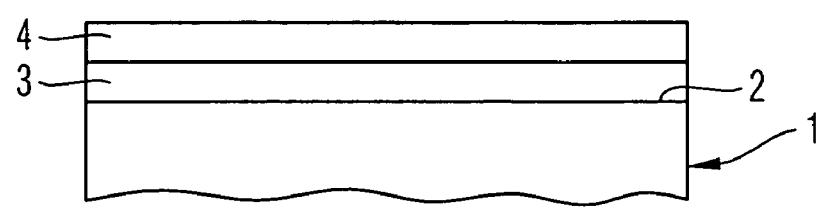
FIG. 4 shows a diagrammatic cross-sectional view of a machine or engine part with wear-resistant coating in accordance with an exemplary embodiment of the present invention.

As illustrated in FIG. 4, in accordance with the present exemplary embodiment, after the supporting and/or bonding layer 3 has been formed, a wear-resistant coating 4 is formed thereon. The wear-resistant coating 4 preferably comprises a nanocrystalline functional layer 4 made up of at least two $CrN_x$ phases or a plurality of functional layers 4 of this type. The surfaces which are to be coated are coated with nanocrystalline layers of $CrN_x$ phases, for example by means of a reactive PVD sputtering process, the layers in each case comprising a meta-stable mixed phase made up predominantly of $Cr_2N$ bonds. The proportion of $Cr_2N$ bonds is preferably over 70%, and consequently the proportion of Cr(N) bonds is less than 30%.

The maximum coating temperature is preferably 260° C., which means that the base material is not tempered during a coating operation.

During the coating process, by way of example in a coating chamber, chromium is vaporized and a nitrogen gas is introduced into the coating chamber as reactive gas, ionized and accelerated onto the surface which is to be coated. At the same time, it combines with the chromium ions which have been expelled, for example by argon ions. The chromium ions which have been expelled combine with the nitrogen that has been introduced and are passed onto the surface to be coated by means of bias voltage applied to the components that are to be coated. The $Cr_2N$ bonds consist, for example, of 70% chromium and 30% nitrogen or less. The proportion of $Cr_2N$ bonds with respect to CrN bonds is likewise approximately 70:30. This ratio is determined by a plurality of process-related parameters, such as for example the bias voltage applied to the surface to be coated, the volumetric flow of argon, the volumetric flow of nitrogen, the rotational speed of the engine part which is to be coated in the coating chamber, the applied magnetic field, etc.

Under certain circumstances, it may be advantageous for carbon to be introduced into the nanocrystalline functional layer 4 by means of subplantation, i.e. carbon atoms are introduced into the first atomic layer of the nanocrystalline functional layer 4 with a high energy and are bonded to it. This subplantation of carbon into the nanocrystalline functional layer 4 results in a lower coefficient of friction than in the case of a conventional chromium nitride layer and a greater adhesive wear resistance.

The nanocrystalline functional layer 4 may be deposited directly on the predetermined surface 2 of the engine part 1 or with the abovementioned supporting layer 3 or bonding layer 3 in between, with a graduated or constant layer composition. The coating process by reactive PVD sputtering is preferably carried out at below the tempering temperature of the heat-treated component.

To obtain favourable tribological and mechanical properties of the layer system, the nanocrystalline functional layer 4, which is in contact with the opposing body, is optimized in terms of the chemical composition, the microstructure and the morphology by the formation of a meta-stable mixed phase between the $Cr_2N$ lattice and the CrN lattice, which are in the nanocrystalline state. A small grain size in the region of 10 nm and the mixed phase comprising predominantly $Cr_2N$ bonds with small proportions of Cr(N) bonds result in considerable widening of the interference lines and low intensities of the reflections under X-ray phase analysis, since in each case only a small number of chrystallites are oriented in such a way that they fulfil the diffraction equation. Compared to other layers, the nanocrystalline layers have fewer defects and a considerably lower increase in roughness. Furthermore, the nanocrystalline structure leads to a drop in the dislocation density, with the result that the risk of crack formation is reduced. Furthermore, the grain boundaries serve as an effective crack barrier, since on account of the grain size of approximately 10 nm, the maximum crack lengths are likewise only approximately 10 nm. Consequently, the stress intensity factor at the tip of the crack when the grain boundary is reached is so low that the grain boundary cannot be overcome and consequently the crack cannot propagate.

The coating is preferably formed with a thickness of from approximately 0.1 μm to approximately 4.0 μm, preferably 2.0 μm. As a result, the change in the dimensions and surface roughnesses is so slight that there is no need for any subsequent machining operation. The coating operation should preferably be carried out in such a manner that no droplets are formed and the roughness increases at most to a roughness average $R_a$ of 0.04 μm.

After the coating operation, the cam contact surface 50 of the tappet 5 is preferably not subject to any further machining operations, in order to ensure optimum tribological and mechanical properties. It is advantageous for so little heat to be introduced during coating that there are no tempering effects in the base material and, by way of example, the uncoated valve stem support has hardness values of at least 650 HV without any subsequent heat treatment. On account of the fact that no subsequent heat treatment is carried out on the base material, in particular the valve stem support, a constant high and reproducible quality of the system as a whole is ensured.

On account of the fact that after the coating operation the coated surface, for example the cam contact surface 51, is not remachined, for example by grinding, lapping polishing, blasting or the like, a surface which is robust in terms of its function and quality and also a surface with a low number of defects and maximum roughness averages of 0.04 μm is ensured.

The coating 4 or 3, 4 in accordance with the present exemplary embodiment, compared to heat-treated surfaces, has considerably higher hardness values, of approximately 2500 HV to 3200 HV, reduced tendency to adhere to the opposing body and improved separation from the opposing body by a lubricating film. On account of the low surface roughness of at most $R_a$=0.04 μm and the topography obtained with the characteristic positive material fractions and shallow slope angles or hills, the opposing body is gently smoothed, resulting in a reduction in the total roughness $R_{Tot}$ of the tribological system comprising bucket tappet 5 and camshaft 6. The high wear resistance and the high hardness mean that the smooth surface and the layer thickness are maintained throughout the entire service life of the engine part or the internal combustion engine.

Figure 3:
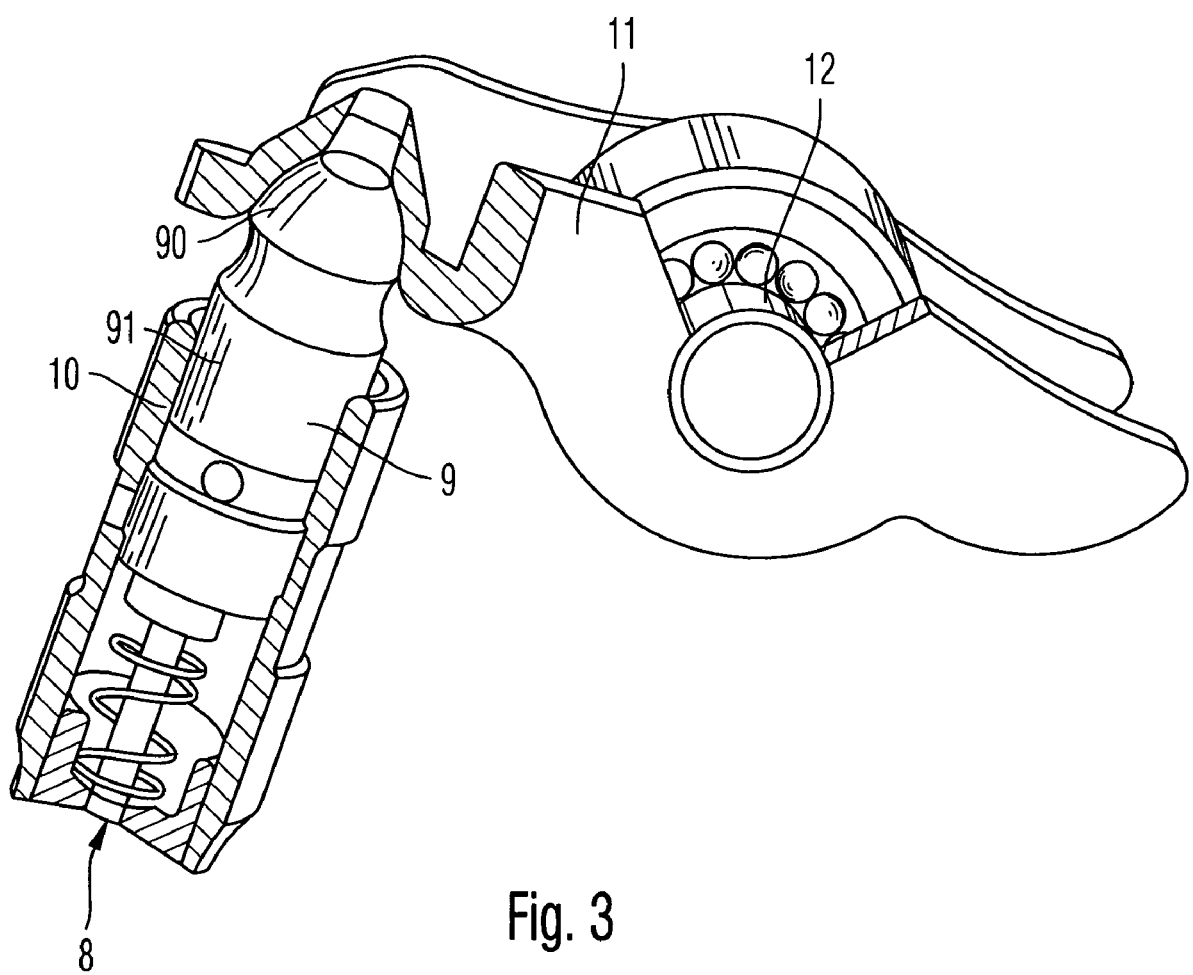
FIG. 3 shows a perspective view of a hydraulic supporting element which is connected to a drag lever via a rolling bearing component.

The text which follows provides a more detailed explanation of a further advantageous use of the coating according to the invention. FIG. 3 illustrates a perspective view of a hydraulic supporting element 8 which includes a piston 9 and a housing 10. The hydraulic supporting element 8 is coupled to a drag lever 11, the drag lever 11 being mounted pivotably by way of a rolling bearing 12. As can also be seen in FIG. 3, the piston 9 has a contact region 90 between the piston 9 and the drag lever 11. Furthermore, the piston 9 has a contact region 91 between the piston 9 and the housing 10. To reduce the wear in the contact region 90 between the piston 9 and the drag lever 11, the contact region 90 is likewise coated with a nanocrystalline functional layer 4 according to the invention, comprising $CrN_x$ mixed phases, for example with a supporting and/or bonding layer in between. In this case, the friction-resistant coating corresponds to the coating 3, 4 explained in the first exemplary embodiment shown in FIG. 1, 2.

Furthermore, it is likewise possible for the contact region 91 between the piston 9 and the housing 10 to be coated with a coating 3, 4 of this type, depending on the particular application and manufacturing technology. This increases the overall service life of the tribological system illustrated, with the result that failure of the individual engine parts during operation can be reduced and therefore overall costs can be saved.

Furthermore, certain rolling bearing components of the rolling bearing 12, for example the rolling body, the inner and outer races of the rolling bearing 12, the rolling bearing cages, the axial discs or the like, can likewise be coated with a nanocrystalline functional layer 4 as described above, for example with a supporting and/or bonding layer 3 in between, in order to increase the wear resistance and to reduce the friction.

Of course, the layer system described above is also suitable for other structural and functional units, such as for example valve stems or valve stem supports, supporting and insertion elements, rolling bearing components, release bearings, piston pins, bearing bushes, control pistons, for example for injection nozzles used in engines, linear guides and other parts which are subject to high mechanical and tribological loads.

At this point, it should be noted that the nanocrystalline functional layer 4 can also be deposited directly on the base body of the engine part that is to be coated without a supporting layer 3 or bonding layer 3 being applied between them.

Consequently, the present invention provides a wear-resistant coating and a process for producing a wear-resistant coating of this type, which increases the wear resistance of machine or engine parts which are exposed to frictional wear and prevents excessively high moments of friction between these machine or engine parts and corresponding opposing bodies. On account of the coating 4 or 3, 4 being approximately 0.1 μm to 4.0 μm thick, the dimensions and surface roughnesses remain virtually unchanged, yet nevertheless the surface is reactively homogenized. The tribological properties of the layer are improved and the mechanical stresses are shared with the base body, which on account of the objective and the low coating temperature, which is lower than 260° C., can be made from inexpensive steels. Consequently, it is possible to use conventional, inexpensive manufacturing technology.

Although the present invention has been described above on the basis of preferred exemplary embodiments, it is not restricted to these embodiments, but rather can be modified in numerous ways.

At this point, it should be noted that the above embodiments can also be implemented using carbon-containing functional layers (Me-C:H, a-C:H, a-C:H:a, ta-C).

LIST OF REFERENCE NUMERALS

1 machine or engine part
2 predetermined surface of the machine or engine part
3 supporting layer/bonding layer
4 nanocrystalline functional layer/$CrN_x$ phase layer
5 bucket tappet
6 cam
7 valve stem
8 hydraulic supporting element
9 piston
10 housing
11 drag lever
12 rolling bearing
50 cam contact surface
51 bucket skirt
90 contact region between piston and drag lever
91 contact region between piston and housing

The invention claimed is:

1. Wear-resistant coating on predetermined surfaces of machine or engine parts, which are exposed to frictional wear, comprising at least one nanocrystalline functional layer made up of at least two $CrN_x$ phases for reducing friction and increasing the wear resistance of the predetermined surface of the machine or engine part, wherein the at least one functional layer has a grain size in the region of 10 nm.

2. Wear-resistant coating according to claim 1, wherein the at least one functional layer consists of a meta-stable mixed phase made up predominantly of $Cr_2N$ bonds and CrN bonds.

3. Wear-resistant coating according to claim 2, wherein the proportion of $Cr_2N$ bonds in the meta-stable mixed phase is at least 70%.

4. Wear-resistant coating according to claim 1, wherein the at least one functional layer has hardness values of between 2500 HV and 3200 HV.

5. Wear-resistant coating according to claim 1, wherein the at least one functional layer has a roughness average $R_a$ of at most 0.04 μm.

6. Wear-resistant coating according to claim 1, wherein the at least one functional layer has a thickness of approximately 0.1 μm to 4.0 μm.

7. Wear-resistant coating according to claim 1, wherein the at least one functional layer comprises a plurality of nanocrystalline individual layers composed of at least two $CrN_x$ phases, it being possible for the individual layers to be applied with a graduated or constant layer composition.

8. Wear-resistant coating according to claim 1, wherein the at least one functional layer includes subplanted carbon.

9. Wear-resistant coating according to claim 1, further comprising at least one supporting layer and/or at least one bonding layer, which is formed by means of a PVD process as a metal-containing carbon layer, as a layer which includes carbides and/or nitrides of transition metals, as a layer which has been nitrocarburized, carbonitrided or case-hardened by means of a heat treatment, as a layer which has been nitrided or bonded by means of a thermochemical process, or as a layer which includes chromium formed by means of an electroplating process, and is provided between the predetermined surface of the machine or engine part and the $CrN_x$ functional layer.

10. Wear-resistant coating according to claim 9, wherein the at least one supporting layer is approximately 0.1 μm to 4.0 μm thick.

11. Wear-resistant coating according to claim 1, wherein the predetermined surface of the machine or engine part consists of 16 MnCr5, C45, 100Cr6, 31CrMoV9, 80Cr2.

12. Wear-resistant coating according to claim 1, wherein the predetermined surface of the machine or engine part has a roughness average $R_a$ of at most 0.03 μm.

13. Use of the wear-resistant coating according to claim 1, as an opposing running layer on a machine or engine part designed as bucket tappet or a drag or rocker lever.

14. Use of a wear-resistant coating according to claim 13, wherein a cam contact surface of the bucket tappet, or a cam contact surface and a bucket skirt of the bucket tappet, are formed at least partially with the wear-resistant coating.

15. Use of the coating according claim 1 as a layer on predetermined surfaces of valve gear components, mechanical and hydraulic bucket tappets, of valve stems or valve stem supports, hydraulic supporting and insertion elements, rolling bearing components, control pistons, in particular for injection nozzles used in engines, of release bearings, of piston pins, of bearing bushes, of linear guides.

16. Process for producing a wear-resistant coating on predetermined surfaces of machine or engine parts which are exposed to frictional wear, comprising the following process step:
applying at least one nanocrystalline functional layer comprising at least two $CrN_x$ phases to the predetermined surface of the machine or engine part for reducing friction and increasing the wear resistance of the predetermined surface of the machine or engine part, such that the at least one functional layer has a grain size in the region of 10 nm.

17. Process according to claim 16, wherein the at least one nanocrystalline functional layer is deposited on the predetermined surface of the machine or engine part by means of a PVD process.

18. Process according to claim 16, wherein the at least one functional layer is formed from a meta-stable mixed phase comprising predominantly $Cr_2N$ bonds and CrN bonds.

19. Process according to at least claim 16, wherein the at least one functional layer is formed with a proportion of $Cr_2N$ bonds in the meta-stable mixed phase which is at least 70%.

20. Process according to claim 16, wherein the at least one functional layer is formed from a plurality of nanocrystalline individual layers comprising at least two $CrN_x$ phases, with the individual layers being applied with a graduated or constant layer composition.

21. Process according to claim 16, wherein carbon is subplanted into the at least one functional layer.

22. Process according to claim 16, wherein at least one supporting layer and/or at least one bonding layer, which is formed by means of a PVD process as a metal-containing carbon layer, as a layer which includes carbides and/or nitrides of transition metals, as a layer which has been nitrocarburized, carbonitrided or case-hardened by means of a heat treatment, as a layer which has been nitrided or bonded by means of a thermochemical process, or as a layer which includes chromium formed by means of an electroplating process and is provided between the predetermined surface of the machine or engine part and the $CrN_x$ functional layer (4).

23. Process according to claim 16, wherein prior to the applying step, the predetermined surface of the machine or engine part is case-hardened and/or carbonitrided and tempered.

24. Process according to claim 16, characterized in that the at least one functional layer (4) which has been deposited is not subjected to any subsequent machining.

25. Process according to claim 16, wherein the application of the at least one functional layer is carried out at a coating temperature which is lower than the tempering temperature of the machine or engine part.

26. Process according to claim 16, wherein no further heat treatment of the predetermined surface of the machine or engine part is carried out.

* * * * *